United States Patent
Higuchi

(10) Patent No.: US 7,167,067 B2
(45) Date of Patent: Jan. 23, 2007

(54) PERMANENT MAGNET-TYPE MAGNETIC FIELD GENERATING DEVICE

(75) Inventor: Dai Higuchi, Takefu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/909,669

(22) Filed: Aug. 2, 2004

(65) Prior Publication Data

US 2005/0030138 A1    Feb. 10, 2005

(30) Foreign Application Priority Data

Aug. 5, 2003    (JP)    ............... 2003-205886

(51) Int. Cl.
*H01F 7/00*    (2006.01)
(52) U.S. Cl. .................... 335/301; 335/306
(58) Field of Classification Search ........ 335/296–306; 315/5.34–5.35; 324/318–320
See application file for complete search history.

(56) References Cited

U.S. PATENT DOCUMENTS

| | | | |
|---|---|---|---|
| 4,810,986 A | 3/1989 | Leupold | 335/301 |
| 5,055,812 A * | 10/1991 | Abele et al. | 335/210 |
| 2004/0104794 A1 | 6/2004 | Kohda et al. | 335/306 |

FOREIGN PATENT DOCUMENTS

| | | |
|---|---|---|
| JP | 63-009102 | 1/1988 |
| JP | 10-41284 | 2/1989 |
| JP | 04-022337 | 1/1992 |
| JP | 05-291026 | 11/1993 |
| JP | 10-041284 | 2/1998 |
| WO | 02/0780180 A1 | 10/2002 |

OTHER PUBLICATIONS

European Search Report corresponding to application No. EP 04018294.1 dated Sep. 23, 2005.

* cited by examiner

*Primary Examiner*—Ramon M. Barrera
(74) *Attorney, Agent, or Firm*—Myers, Bigel, Sibley, & Sajovec, P.A.

(57) ABSTRACT

To reduce the skew angle components in a dipole ring magnetic field generating device, a magnetic field generating device 1 is provided in which comprises: a plurality of magnet elements 101 to 124 arranged in a ring shape such that a magnetization direction of the magnet elements undergoes one rotation over half a circumference of the ring, wherein the magnet elements generate a substantially unidirectional magnetic field in a space within the ring; and corrective magnets 201 to 204 arranged on an outer edge portion forming an aperture in a Z-axis direction of the magnetic field generating device, wherein the Z-axis is defined as a central axis of the magnetic field generating device, the Y-axis is defined as a direction perpendicular to the Z-axis and parallel to the unidirectional magnetic field, and the X axis is defined as a direction perpendicular to the Z axis and the Y axis.

2 Claims, 4 Drawing Sheets

PERMANENT MAGNET-TYPE MAGNETIC FIELD GENERATING DEVICE

RELATED APPLICATION

This application claims priority from Japanese Patent Application No. 2003-205886, filed Aug. 5, 2003, the disclosure of which is incorporated by reference herein in its entirety.

BACKGROUND OF THE INVENTION

1. Field of the Invention

The present invention relates to dipole ring magnetic field generating devices.

2. Description of Related Art

A dipole ring magnetic field generating device is a magnetic field generating device comprising a plurality of magnet elements arranged in a ring shape such that a magnetization direction of the magnet elements undergoes one rotation over half a circumference of the ring, wherein the magnet elements generate a substantially unidirectional magnetic field in a space within the ring, as will be explained in more detailed below, and preferably, the magnet elements have the substantially the same maximum energy product. Thus arranging the magnets regularly along the circumference of a circle, a magnetic field that is substantially unidirectional and moreover preferably of substantially uniform strength can be generated in the space within the ring. Such dipole ring magnetic field generating devices are widely used, for example, for magnetic resonance imaging (MRI) devices and semiconductor element fabrication processes, as well as for uniform magnetic field generating means for fundamental research. Conventionally, normal electromagnets or superconducting electromagnets are used as means for generating a uniaxial uniform magnetic field. However, due to recent research in high-performance rare earth permanent magnets, rare earth permanent magnets (also referred to simply as "permanent magnets" in the following) are becoming mainstream in uniform magnetic field generating devices for weak magnetic fields of not more than, for example, 1 T (tesla: kg·s$^{-2}$·A$^{-1}$).

Referring to FIGS. 7 and 8, the following is an explanation of a conventional dipole ring magnetic field generating device and the constituent magnets used to configure this device.

FIG. 7 is a cross-sectional view of a dipole ring magnetic field generating device 1 taken from a direction perpendicular to the radial direction. As shown in FIG. 7, the dipole ring magnetic field generating device 1 includes a plurality of constituent magnets 101 to 124 that are arranged in a ring, and preferably, their outer circumference is enclosed by a ring-shaped outer yoke 2. Preferably, the individual constituent magnets 101 to 124 are magnetized in the directions given by the Equations (1) and (2), as will be explained in more detail below, and constituent magnets corresponding to opposite poles as seen from the center axis (for example, the constituent magnets 101 and 113) are magnetized with an angular difference of 180°, such that these constituent magnets have the same magnetization direction when they are arranged in a ring. Thus, when the constituent magnets 101 to 124 are arranged in a ring, the magnetization direction of the constituent magnets undergoes one rotation over half a circumference of the ring. With this configuration, a magnetic field is generated in the space within the ring of the dipole ring magnetic field generating device 1, which is substantially unidirectional and preferably of substantially uniform strength. It should be noted that it is preferable that the constituent magnets 101 to 124 have a magnetic field of the same strength as that unidirectional magnetic field.

For the constituent magnets 101 to 124, it is possible to use substantially trapezoidal or fan-shaped Nd—Fe—B, Sm—Co or Sm—N—Fe permanent magnets or the like. For the outer portion, it is possible to use a ring-shaped ferromagnetic or non-magnetic material as the outer yoke 2. In particular when a ferromagnetic material is used for the outer yoke 2, the magnetic efficiency is increased, if only slightly. Furthermore, the constituent magnets may be partitioned into 4 to 60 sections. In particular, in view of the magnetic efficiency and the difficulty of the circuit fabrication, it is preferable that the number of constituent magnets is set to a range of about 12 to 36.

As noted above, the constituent magnets 101 to 124, which are made of permanent magnets, are respectively magnetized with a specific period with respect to the radial direction, and seen from the central axis on the inner side, the constituent magnets corresponding to opposing poles are magnetized at an angular difference of 180°. Furthermore, adjacent constituent magnets are preferably magnetized at an angular difference as given in Equations (1) and (2). It should be noted that there may be changes of up to about ±5° in the magnetization directions, depending on usage conditions and optimization.

$$\theta n = -\frac{360}{N} * n \qquad (n = 1, 2, \ldots N/2) \qquad (1)$$

$$\theta n = 360\left(\frac{n}{N} - 1\right) \qquad (n = N/2+1, N/2+2, \ldots N) \qquad (2)$$

θn: magnetization direction of n-th constituent magnet
N: total partition number (integer) of the magnetic field generating device
n: segment number (integer)

FIG. 8 is a schematic cross-sectional view of the dipole ring magnetic field generating device, taken at a plane perpendicular to the central axis. As shown in FIG. 8, when the Z axis is defined as the central axis of the magnetic field generating device, the Y axis is defined as the direction perpendicular to the Z-axis and substantially parallel to the unidirectional field generated in the space (on the radially inward side) within the ring (i.e. the NS magnetic field direction; direction of the main magnetic field component in FIG. 8), and the X axis is defined as the direction perpendicular to the Z-axis and the Y-axis (EW direction), then when the NS magnetic field direction (Y-axis direction) generated on the radially inward side of the dipole ring magnetic field generating device is taken to correspond to 0°, the angle of the magnetic field vector (also referred to as "skew angle" in the following) at any point on the radially inward side of the cylinder is substantially 0° at the radial center, due to the characteristics of the magnetic field generating device. On the other hand, an inclination of the skew angle can be observed that worsens (increases) when approaching the inner wall of the circuit.

When using an ordinary dipole ring magnetic field generating device, magnetic field components in which this skew angle is large often can be observed as impurities, that is, as noise. In particular the skew angle components in the plane (XY plane) on the radially inward side of the cylinder as shown in FIG. 8 seem to greatly affect the performance of elements manufactured with a manufacturing process of a substrate for semiconductors or the like, in particular with a process involving a heating step. For this reason the skew angle components need to be kept as small as possible.

In addition to the inner side of the dipole ring magnetic field generating device, these skew angle components are slower attenuated than the main magnetic field component on the outer side of the circuit, that is, at the aperture portions, so that the skew angle becomes larger on the outer side of the aperture portion. For this reason, when, in order to increase the throughput for example in view of mass production, a substrate that is still hot is retrieved to the outside of the circuit, then the skew angle components may cause considerable damage.

Moreover, Shin-Etsu Chemical Co. Ltd. has applied for a patent regarding a plasma processing device in which magnets are attached to the lateral wall of a dipole ring, for the purpose of reducing the magnetic field leaked from the dipole ring (see JP 10-041284A). However, even though it is possible to reduce the magnetic field leaked to the periphery, the reduction of the noise magnetic field in the extension of the radially inner space of the cylinder has been impossible.

SUMMARY OF THE INVENTION

It is thus an object of the present invention to provide a dipole ring magnetic field generating device that does not strongly affect wafers or the like, in which skew angle components of an unnecessary noise magnetic field are reduced not only on the radially inward side of the circuit but also on the outer side, that is, outside the circuit.

In accordance with the present invention, magnetic field generating device comprising: a plurality of magnet elements arranged in a ring shape such that a magnetization direction of the magnet elements undergoes one rotation over half a circumference of the ring, wherein the magnet elements generate a substantially unidirectional magnetic field in a space within the ring; and one or more corrective magnets arranged on an outer edge portion forming an aperture in a Z-axis direction of the magnetic field generating device, wherein the Z-axis is defined as a central axis of the magnetic field generating device, the Y-axis is defined as a direction perpendicular to the Z-axis and parallel to the unidirectional magnetic field, and the X axis is defined as a direction perpendicular to the Z axis and the Y axis.

With the magnetic field generating device according to the present invention, the skew angle components generated in XY plane in an extension in Z-direction of the inner space can be reduced, and adverse effects on substrates retrieved from the circuit while still being hot can be reduced by arranging the corrective magnets for correcting the skew angle components at a region outside the circuit in the Z-axis direction of the magnetic field generating device, that is, near the aperture portion.

As detailed below, with the present invention, it is possible to delete noise magnetic field components near the aperture portion and to attain a low skew angle and a magnetic field with high uniformity, without influencing the space of the uniform magnetic field of the dipole ring magnetic field generating device.

Various aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms a.s well, unless the context clearly indicates otherwise.

Unless otherwise defined, all technical and scientific terms used herein have the same meaning as commonly understood by one of ordinary skill in the art to which this invention belongs.

DETAILED DESCRIPTION OF PREFERRED EMBODIMENTS

Referring to the accompanying drawings, the following is an explanation of an example of an embodiment of the present invention. However, the scope of the present invention is by no means limited to this embodiment.

Figure 1:
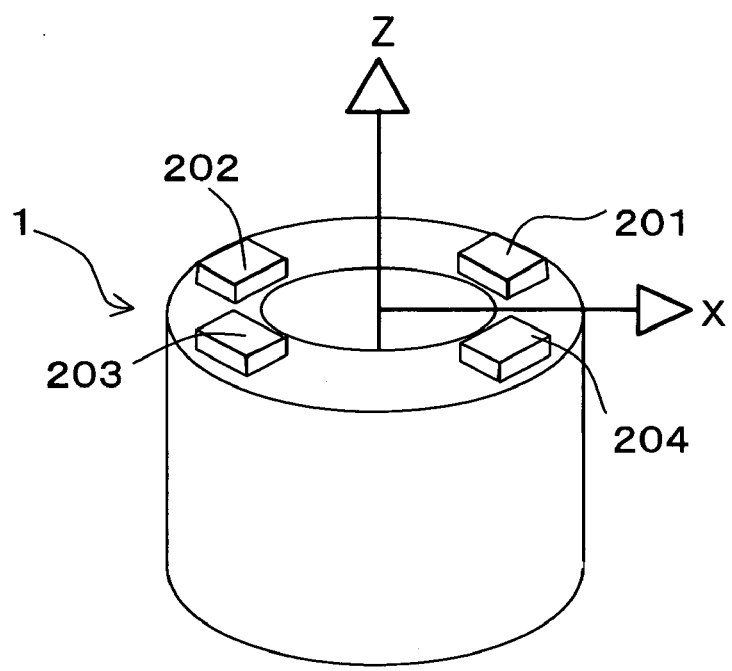
FIG. 1 shows a schematic birds-eye view of a dipole ring magnetic field generating device according to the present invention.

The inventors of this application found that as illustrated in FIG. 1, in a dipole ring magnetic field generating device 1, when the Z-axis is defined as the central axis on the radially inward side of the magnetic field generating device, the Y-axis is defined as the NS direction of the magnetic field generating device, and the X-axis is defined as the EW direction, the skew angle stemming from impure field components near the aperture portion is reduced by positioning correctional magnets 201 to 204 at positions at the end of the circuit in the Z-axis direction of the magnetic field generating device, that is, near the aperture portion, those position preferably being mirror symmetric with respect to the YZ plane and the ZX plane serving as reference planes, and optimizing the dimensions and positions of the correctional magnets as well as the size and direction of their magnetic fields using various types of mathematical algorithms, such as the quasi-Newton method or a search method. Thus the inventors conceived of the present invention.

More specifically, even though there is no particular limitation, magnets of any suitable shape, such as rectangular blocks, cylinders or other shapes obtained by an optimization calculation, may be used for the corrective magnets. For example, if corrective magnets are rectangular blocks, then, regarding the outer diameter of the magnetic field generating device as 1, the length of one side of the bottom surface of the corrective magnets is preferably 0.05 to 0.2, and when the length of the magnetic field generating device in the Z-axis direction is regarded as 1, then the height of the corrective magnets is preferably 0.01 to 0.1. Moreover, when the size of the magnetic field in one direction of the magnetic field generating device is regarded as 1, then corrective magnets of such a shape that the size of their magnetic field is preferably 0.005 to 0.02 can be used.

Moreover, as noted above, the corrective magnets are arranged on the outer edge portion where the aperture is formed in the Z-axis direction of the magnetic field generating device. Here, in addition to the edge portion of the magnetic field generating device in the Z-axis direction, "outer edge portion" may include the lateral surface on the outer circumferential surface of the magnetic field generating device and the lateral surface on the inner circumferential surface of the magnetic field generating device. Moreover, the corrective magnets may also be arranged to the inner circumferential side or to the outer circumferential side at the end of the magnetic field generating device. Moreover, the corrective magnets do not have to directly contact the constituent magnets of the magnetic field generating device. Furthermore, the corrective magnets may be arranged such that they are symmetric with respect to at least one of the X-axis, the Y-axis and the Z-axis. It is preferable that the corrective magnets cover 2 to 10% of the surface area of at least one end portion of the magnetic field generating device. Here, the surface area of the end portion in the Z-axis direction of the magnetic field generating device means the surface area of the surface on which, for example, the corrective magnets 201 to 204 of the magnetic field generating device 1 in FIG. 1 are arranged, and does not include the surface area of the aperture portion. Moreover, as explained below in more detail, it is preferable that the corrective magnets are arranged with such a magnetization direction that the positions of the corrective magnets and the directions of their magnetic field are symmetric with respect to at least one of the X-axis, the Y-axis and the Z-axis.

Figure 7:
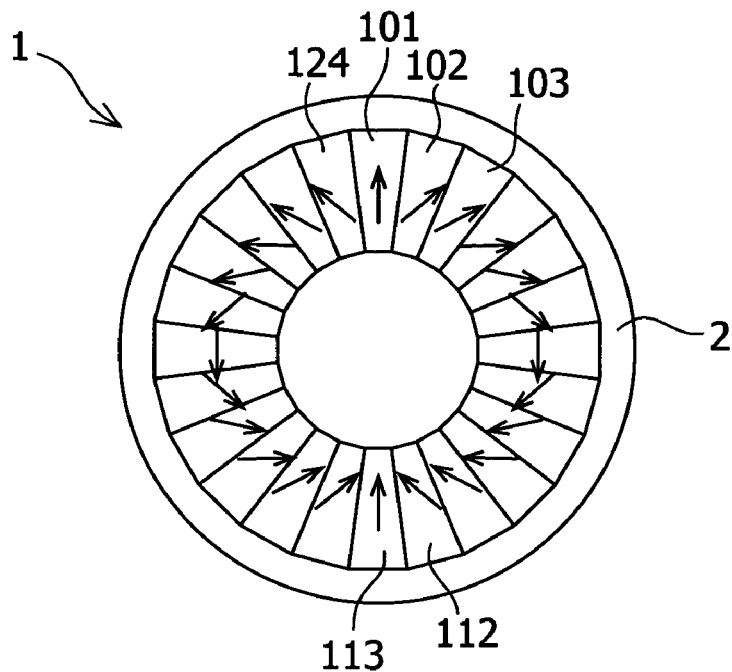
FIG. 7 shows a schematic cross-sectional view of a conventional dipole ring magnetic field generating device, taken at a plane perpendicular to the central axis.
Figure 8:
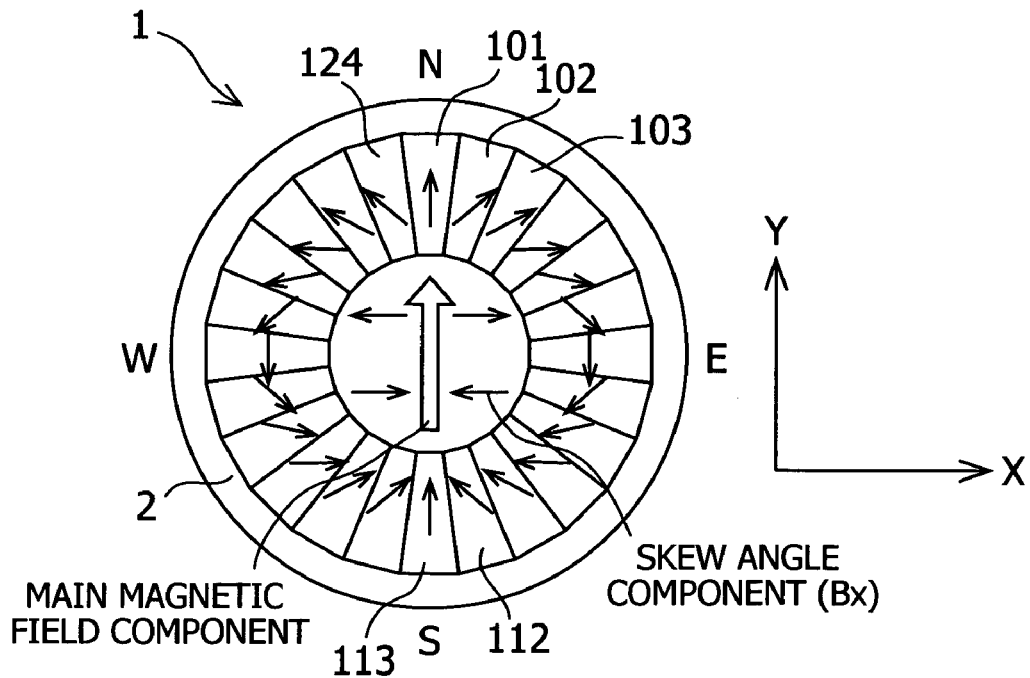
FIG. 8 shows a schematic cross-sectional view of a conventional dipole ring magnetic field generating device, taken at a plane perpendicular to the central axis.

The basic configuration and principle of a dipole ring magnetic field generating device according to the present invention follows that of the conventional dipole ring magnetic field generating device 1 explained using FIG. 7. The dipole ring magnetic field generating device 1 according to FIG. 7 has already been explained above, so that structural aspects corresponding to the dipole ring magnetic field generating device 1 are not further explained, or explained only briefly. It should be noted that as in conventional dipole ring magnetic field generating devices, Nd—Fe—B, Sm—Co or Sm—N—Fe rare earth permanent magnets or the like may be used for the constituent magnets and the corrective magnets. More specifically, it is possible to use Nd—Fe—B magnets, which are relatively inexpensive and have a high energy product, although there is no limitation to this.

Figure 2:
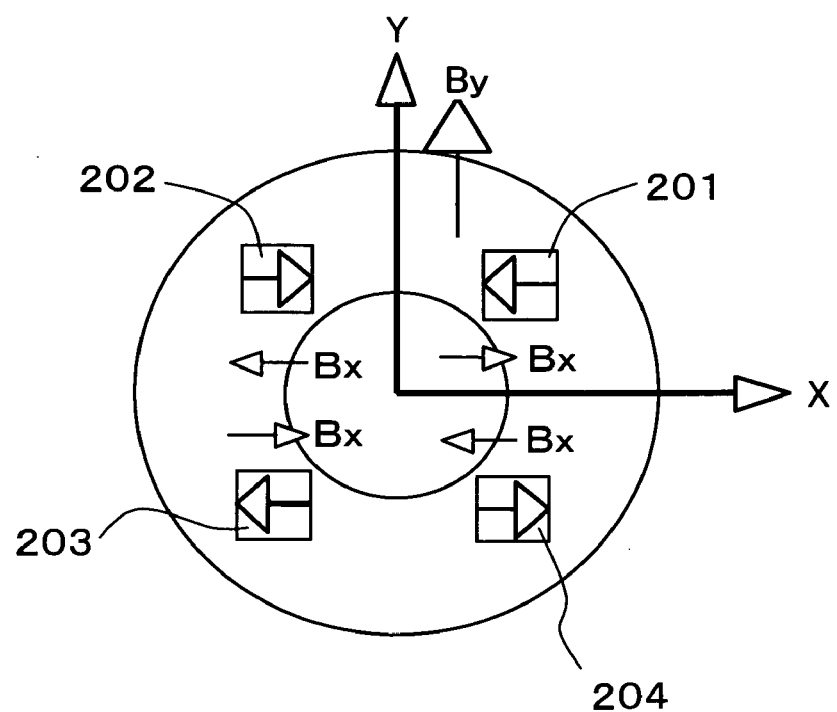
FIG. 2 shows a diagram illustrating the arrangement of the corrective magnets at the aperture portion of a dipole ring magnetic field generating device according to the present invention.

FIG. 2 is a diagram illustrating the arrangement of the corrective magnets at the aperture portion of the dipole ring magnetic field generating device. Referring to FIG. 2, the following is an embodiment of the present invention. It is preferable that the corrective magnets 201 to 204 disposed at the aperture portion of the dipole ring magnetic field generating device 1 are arranged such that their magnetization directions are mirror-symmetric with respect to the YZ plane extended from the center. That is to say, it is possible to effectively reduce the skew angle components by arranging the corrective magnets 201 to 204 at positions that are symmetric to the YZ plane and such that their magnetic fields point in opposite direction with respect to the X-axis direction (and in the same direction with respect to the Y-axis direction). This is due to the fact that the skew angle distribution at the aperture portion of the magnetic field of the dipole ring magnetic field generating device 1, that is, the distribution of the magnetic field components in the X-axis direction (referred to as "Bx" below) is mirror symmetric with respect to the above-noted reference plane (YZ plane).

The Bx components are distributed, from the uniform space of the dipole ring magnetic field generating device 1 in the Z-axis direction, in substantially the same direction, independently from the Z-axis coordinate. If the By component is defined for example as the direction shown in FIG. 2, then the magnetic field components of the Bx component will not change suddenly, even when the position in the Z-axis direction is varied. Therefore, if the corrective magnets 201 to 204 are arranged so as to cancel the Bx magnetic field components of the aperture portion of the dipole ring magnetic field generating device 1, then it becomes possible to eliminate the Bx components over the entire vicinity of the aperture portion. Moreover, the Bx components are distributed in substantially the same direction regardless of the Z-axis coordinate, so that it is possible to effectively decrease the skew angle components by arranging the corrective magnets at positions and with magnetization directions that are mirror symmetric with respect to the XY plane.

Moreover, as explained above, the constituent magnets 101 to 124 of the dipole ring magnetic field generating device 1 are arranged such that their magnetization direction undergoes one rotation over half a circumference of the ring. That is to say, when the constituent magnets corresponding to opposite poles when seen from the central axis (Z axis) are magnetized at an angular difference of 180° and arranged in a ring, then the magnetization direction of those constituent magnets becomes the same. For this reason, also the magnetic field of the dipole ring magnetic field generating device 1 has substantially the same size and the same orientation at positions corresponding to opposite poles when seen from the central axis (Z axis). Consequently, it is possible to effectively reduce the skew angle components by arranging corrective magnets having a magnetic field of the same orientation at positions that are point-symmetric with respect to the Z axis.

Moreover, because the magnetic field of the dipole ring magnetic field generating device 1 is mirror symmetric with respect to the YZ plane and point symmetric with respect to the Z axis as explained above, when considering the magnetic field of the dipole ring magnetic field generating device 1 with respect to the ZX plane, it is evident that the magnetic fields at positions that are symmetric with respect to the ZX plane have Y-components pointing in the same direction and X-components pointing in opposite directions. For this reason, when the corrective magnets are arranged in order to cancel the Bx components of the magnetic field, then it is possible to effectively reduce the skew angle components by letting the constituent magnets at positions symmetric to the ZX plane have magnetic field components with the same orientation in Y-axis direction and with opposite orientation in X-axis direction.

Thus, if the corrective magnets are arranged in order to reduce the Bx components near the aperture portion, then it is preferable that they are arranged such that their magnetization directions are symmetric with respect to the reference axes. Here, arrangements that are symmetric with respect to the reference axes (at least one of the X axis, the Y axis and the Z axis) also include arrangements with magnetic fields having opposite orientation with respect to the X-axis direction and the same orientation with respect to the Y-axis direction at positions symmetric to the YZ plane; arrangements with magnetic fields having the same orientation at positions symmetric to the XY plane; arrangements with magnetic fields having the same orientation at positions that are point-symmetric with respect to the Z axis; and arrangements with magnetic fields having opposite orientation with respect to the X-axis direction and the same orientation with respect to the Y-axis direction at positions that are symmetric to the ZX plane. It should be noted that more precise positioning as well as size and number of the magnet, and size and orientation of the magnetic field and so forth may be determined by an optimization calculation involving a mathematical algorithm for example, and at times this calculation may be made in adaptation to an actually measured magnetic field of the magnetic field generating device, so that in those cases the symmetry may be lost to some degree.

More specifically, the corrective magnets 201 to 204 may have a magnetic field of the same strength, and may be arranged such that the magnetic flux of the corrective magnet 201, which is disposed at a position with X>0 and Y>0, points in negative X axis direction, the magnetic flux of the corrective magnet 202 (X<0, Y>0) points in positive X axis direction, the magnetic flux of the corrective magnet 203 (X<0, Y<0) points in negative X axis direction, and the magnetic flux of the corrective magnet 204 (X>0, Y<0) points in positive X axis direction. This is because, as pointed out above, the Bx components of the magnetic field near the aperture portion of the dipole ring magnetic field generating device 1 are ordinarily oriented in the opposite direction. With such an arrangement, the positions and the magnetic flux orientations are mirror symmetric with respect to the YZ plane, and the positions are mirror symmetric with respect to the ZX plane. As for the mirror symmetry with respect to the ZX plane, the orientation of the magnetic flux of corresponding corrective magnets is the same with regard to the Y-axis direction and opposite with regard to the X-axis direction. In other words, in this case, the corrective magnets are arranged at positions symmetric with respect to the Z axis, and the orientations of their magnetic flux are the same for corresponding corrective magnets.

Figure 3:
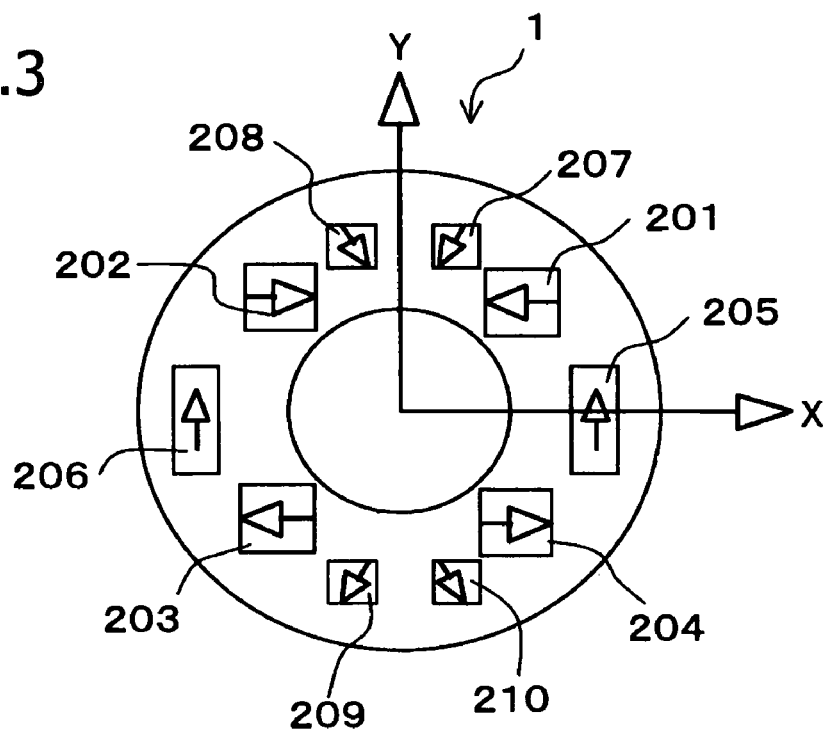
FIG. 3 shows a diagram illustrating the arrangement of the corrective magnets at the aperture portion of a dipole ring magnetic field generating device according to the present invention.

Moreover, these corrective magnets can be placed by any method on the outer edge portion forming the aperture in the Z-axis direction of the magnetic field generating device, as long as they are arranged such that the Bx magnetic field components are canceled, for example as described above. For example, the corrective magnets can be attached after the circuit has been completed. There is no particular limitation regarding the attachment method, and it is possible to fix the corrective magnets using an adhesive, to fix them mechanically by bolts or the like, or to cover the magnets using a casing made of stainless steel or the like. Moreover, in this case, a strong magnetic field may be generated near the aperture portion, so that it may be difficult to attach overly strong magnets. In this case, instead of using four corrective magnets, it is also possible to partition the corrective magnets into a larger number of smaller magnets, as appropriate, as in FIG. 3, which shows a diagrammatic representation of the arrangement of corrective magnets at the aperture portion of a dipole ring magnetic field generating device.

More specifically, in addition to the corrective magnets 201 to 204 of the above-described FIG. 2, corrective magnets 205 and 206 having a magnetic flux pointing in positive Y-axis direction are arranged at negative and positive positions on the X axis; a corrective magnet 207 having a magnetic flux pointing in the negative X-axis direction and the negative Y-axis direction is arranged at a position with X>0 and Y>0, but closer to the Y axis than the corrective magnet 201; a corrective magnet 208 having a magnetic flux pointing in the positive X-axis direction and the negative Y-axis direction is arranged at a position with X<0 and Y>0, but closer to the Y axis than the corrective magnet 202; a corrective magnet 209 having a magnetic flux pointing in the negative X-axis direction and the negative Y-axis direction is arranged at a position with X<0 and Y<0, but closer to the Y axis than the corrective magnet 203; and a corrective magnet 210 having a magnetic flux pointing in the positive X-axis direction and the negative Y-axis direction is arranged at a position with X>0 and Y<0, but closer to the Y axis than the corrective magnet 204. In this case, the strength of the magnetic flux of the individual corrective magnets can be made smaller than in the case shown in FIG. 2, and it becomes easier to attach these corrective magnets after the constituent magnets have been arranged in the dipole ring magnetic field generating device.

EXAMPLE

Figure 4:
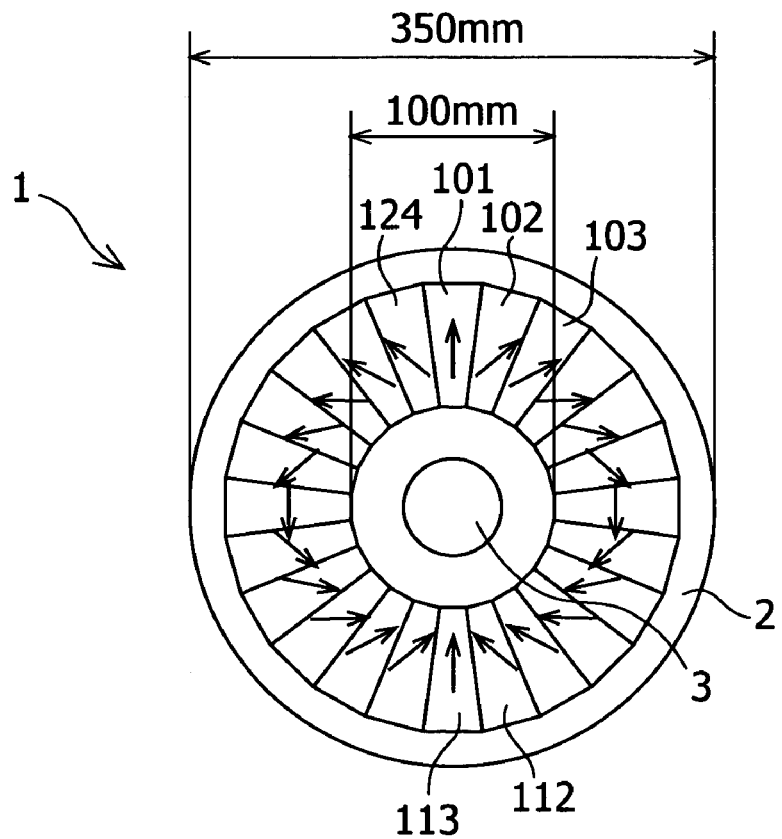
FIG. 4 shows a schematic cross-sectional view of the dipole ring magnetic field generating device according to the working example of the present invention, taken at a plane that is perpendicular to the central axis.

FIG. 4 shows a schematic cross-sectional view of the dipole ring magnetic field generating device 1 according to a working example of the present invention through a plane perpendicular to the central axis. In this working example, a dipole ring magnetic field generating device 1 having the shape shown in FIG. 4 was fabricated. That is to say, in this dipole ring magnetic field generating device 1, 24 substantially trapezoidal constituent magnets 101 to 124 are arranged in a ring, and their outer circumference is enclosed by a ring-shaped outer yoke 2. The individual constituent magnets 101 to 124 are magnetized in the directions given by Equations (1) and (2), and constituent magnets corresponding to opposite poles as seen from the center axis are magnetized with an angular difference of 180°. Thus, when the constituent magnets 101 to 124 are arranged in a ring, the magnetization direction of the constituent magnets undergoes one rotation over half a circumference of the ring. With this configuration, a magnetic field that is substantially unidirectional is generated in the space within the ring of the dipole ring magnetic field generating device 1. The outer diameter of this dipole ring magnetic field generating device 1 including the outer yoke 2 is set to 350 mm, the inner diameter of the inner space formed by the constituent magnets 101 to 124 is set to 100 mm, and the depth of the circuit is set to 300 mm. Moreover, a magnetic field evaluation space 3, which has a diameter of 50 mm and a depth of 100 mm, is of cylindrical shape with the central axis of the space on the radially inward side of the circuit as the main axis, and the center on the radially inward side is identical with the center of the uniformity space (magnetic field evaluation space 3), which is the usual spatial design when using ordinary dipole ring magnetic field generating devices. Neodymium rare-earth sintered magnets (with a maximum energy product of 350 kJ/m³) were used for the constituent magnets 101 to 124, and a non-magnetic material such as aluminum is used for the outer yoke 2.

Figure 5:
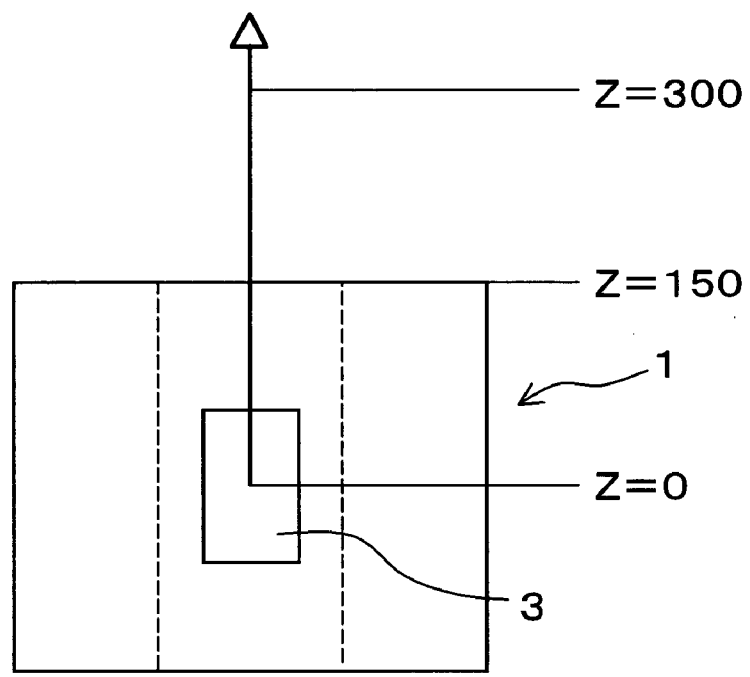
FIG. 5 shows a schematic cross-sectional view of the dipole ring magnetic field generating device according to the working example of the present invention, taken at a plane through the central axis.

First, using this dipole ring, the magnetic field Bx near the aperture portion was measured without corrective magnets. FIG. 5 is a schematic cross-sectional view of the dipole ring magnetic field generating device according to this working example, taken at a plane through the center axis. Table 1 shows the maximum value of the magnetic field Bx within the various planes of the magnetic field evaluation space 3 at the heights of various Z-coordinates from Z=0 to Z=300 mm, when taking the center of the circuit magnetic field evaluation space 3 as Z=0, and the circuit edge portion (aperture portion) as Z=150, as shown in FIG. 5. It should be noted that the magnetic field Bx is given in gauss {1 T (Tesla)=10,000 gauss}.

TABLE 1

| Z [mm] | Bx [gauss] |
| --- | --- |
| 0 | 55 |
| 50 | 75 |
| 100 | 212 |
| 150 | 39 |
| 200 | 240 |
| 250 | 149 |
| 300 | 97 |

Figure 6:
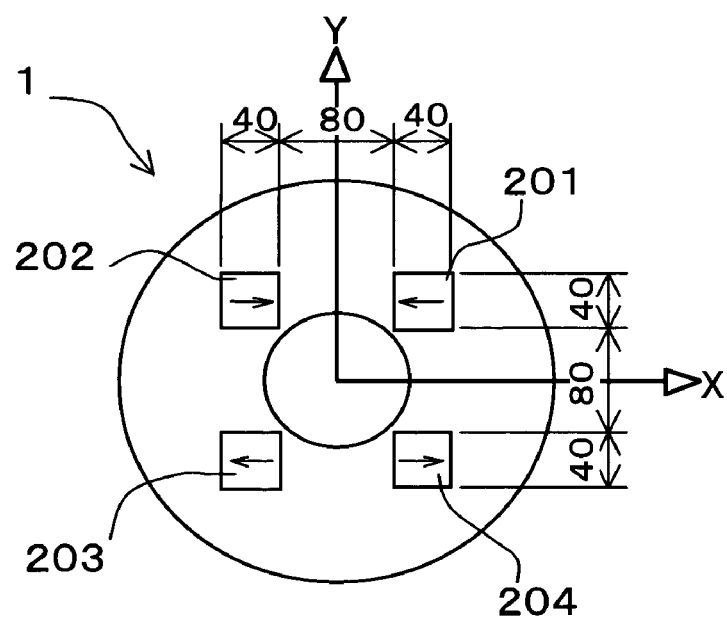
FIG. 6 shows a diagram of the circuit edge portion of the dipole ring magnetic field generating device according to the working example of the present invention.

FIG. 6 shows a diagram of the circuit edge portion of the dipole ring magnetic field generating device 1 according to this working example. Next, corrective magnets 201 to 204 (with a total surface area of about 7.2%) were arranged with the dimensions and positions shown in FIG. 6 at the aperture portion of the magnetic field generating device shown in FIG. 4. That is to say, the corrective magnets 201 to 204 were rectangular blocks with a length of 40 mm, a width of 40 mm and a thickness of 20 mm, and were arranged at a distance of 40 mm from both the X axis and the Y axis such that the sides of the corrective magnets were respectively parallel to the X, Y and Z axes. Each of the corrective magnets 201 to 204 included a neodymium rare-earth sintered magnet (with a maximum energy product of 350 kJ/m³). The corrective magnet 201 arranged at the position X>0 and Y>0 was arranged such that its magnetic flux pointed in the negative X-axis direction, the corrective magnet 202 (X<0, Y>0) was arranged such that its magnetic flux points in the positive X-axis direction, the corrective magnet 203 (X<0, Y<0) was arranged such that its magnetic flux pointed in the negative X-axis direction, and the corrective magnet 204 (X>0, Y<0) was arranged such that its magnetic flux pointed in the positive X-axis direction. Table 2 shows the magnetic field Bx for this case, measured in the same manner as without the corrective magnets. Table 2 shows that when the corrective magnets 201 to 204 are arranged in this manner, the magnetic field Bx from the aperture portion to positions further outward can be reduced considerably compared to the case without the corrective magnets. Furthermore, by arranging the corrective magnets 201 to 204 symmetrically in X axis direction with their magnetic fluxes pointing in opposite directions, the magnetic field Bx could be reduced more than with an asymmetric arrangement.

TABLE 2

| Z [mm] | Bx [gauss] (uncorrected) | Bx [gauss] (corrected) |
| --- | --- | --- |
| 0 | 55 | 55 |
| 50 | 75 | 75 |
| 100 | 212 | 210 |
| 150 | 39 | 21 |
| 200 | 240 | 55 |
| 250 | 149 | 34 |
| 300 | 97 | 22 |

What is claimed is:

1. A magnetic field generating device comprising:
a plurality of magnet elements arranged in a ring shape such that a magnetization direction of the magnet elements undergoes one rotation over half a circumference of the ring, wherein the magnet elements generate a substantially unidirectional magnetic field in a space within the ring; and
one or more corrective magnets arranged only on an outer edge portion and not on a lateral surface on an inner circumferential surface of said magnetic field generating device, wherein an aperture is formed in a Z-axis direction of the magnetic field generating device, wherein the Z-axis is defined as a central axis of the magnetic field generating device, the Y-axis is defined as a direction perpendicular to the Z-axis and parallel to the unidirectional magnetic field, and the X-axis is defined as a direction perpendicular to the Z-axis and the Y-axis.

2. The magnetic field generating device according to claim 1, wherein the corrective magnets are arranged such that the magnetization directions of the corrective magnets are symmetric with respect to at least one of the X-axis, the Y-axis and the Z-axis.

* * * * *

UNITED STATES PATENT AND TRADEMARK OFFICE
CERTIFICATE OF CORRECTION

PATENT NO. : 7,167,067 B2
APPLICATION NO. : 10/909669
DATED : January 23, 2007
INVENTOR(S) : Higuchi It is certified that error appears in the above-identified patent and that said Letters Patent is hereby corrected as shown below:

Column 10,

Line 43: After "the Y-axis" please insert:
--wherein the corrective magnets cover 2 to 10% of a surface area of at least one end in the Z-axis direction of the magnetic field generating device.--

Signed and Sealed this

Twenty-ninth Day of May, 2007

JON W. DUDAS
*Director of the United States Patent and Trademark Office*